US008887019B2

(12) United States Patent
Chakravadhanula et al.

(10) Patent No.: US 8,887,019 B2
(45) Date of Patent: Nov. 11, 2014

(54) METHOD AND SYSTEM FOR PROVIDING EFFICIENT ON-PRODUCT CLOCK GENERATION FOR DOMAINS COMPATIBLE WITH COMPRESSION

(75) Inventors: Karishna Chakravadhanula, Vestal, NY (US); Brion Keller, Binghamton, NY (US); Ramana Malneedi, Apex, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 582 days.

(21) Appl. No.: 12/946,995

(22) Filed: Nov. 16, 2010

(65) Prior Publication Data

US 2012/0124423 A1     May 17, 2012

(51) Int. Cl.
| G06F 11/273 | (2006.01) |
| G06F 11/26 | (2006.01) |
| G01R 31/317 | (2006.01) |
| G01R 31/3185 | (2006.01) |

(52) U.S. Cl.
CPC .. *G01R 31/31727* (2013.01); *G01R 31/318536* (2013.01)
USPC ............................ 714/731; 714/726; 714/744

(58) Field of Classification Search
USPC .......................................... 714/726, 731, 744
See application file for complete search history.

(56) References Cited

U.S. PATENT DOCUMENTS

| 6,442,722 | B1 * | 8/2002 | Nadeau-Dostie et al. .... | 714/731 |
| 6,903,582 | B2 * | 6/2005 | Gaskins et al. ............... | 327/141 |
| 6,993,696 | B1 * | 1/2006 | Tanizaki et al. .............. | 714/744 |
| 7,305,598 | B1 * | 12/2007 | Sanghani et al. ............ | 714/724 |
| 7,319,729 | B2 * | 1/2008 | Gundurao et al. ........... | 375/354 |
| 7,330,994 | B2 * | 2/2008 | Frederick ..................... | 713/600 |
| 7,549,092 | B2 * | 6/2009 | Jang .............................. | 714/700 |
| 7,624,322 | B2 * | 11/2009 | Duggal et al. ................ | 714/731 |
| 7,734,967 | B2 * | 6/2010 | Chung et al. ................. | 714/719 |
| 7,840,861 | B2 * | 11/2010 | Sul ............................... | 714/726 |
| 7,908,536 | B2 * | 3/2011 | Chelstrom et al. ........... | 714/731 |
| 8,381,051 | B2 * | 2/2013 | Bahl et al. .................... | 714/731 |
| 8,468,404 | B1 * | 6/2013 | Chickermane et al. ...... | 714/729 |
| 2010/0162060 | A1 * | 6/2010 | Chakravarty et al. ........ | 714/731 |
| 2012/0030532 | A1 * | 2/2012 | Jain et al. ..................... | 714/726 |

OTHER PUBLICATIONS

Low cost at-speed testing using On-Product Clock Generation compatible with test compression by Keller et al Published in: Test Conference (ITC), 2010 IEEE International, Nov. 2-4, 2010 Print ISBN: 978-1-4244-7206-2.*

* cited by examiner

*Primary Examiner* — Joseph Schell
(74) *Attorney, Agent, or Firm* — Dickstein Shapiro LLP

(57) ABSTRACT

A method and system for providing on-product clocks for domains compatible with compression is disclosed. According to one embodiment, a base signal received from automated test equipment has a frequency for testing a plurality of clock domains and programming instruction for first and second clock domains of a plurality of clock domains. First and second clock signals are generated from the base clock signal based on the programming instruction. A first delay for the first clock signal and a second delay for the second clock signal are determined from the programming instruction. A test sequence is provided to test a first clock domain and a second clock domain. The test sequence comprises the first clock signal delayed by the first delay and the second clock signal delayed by the second delay. The first clock drives the first clock domain and the second clock derives the second clock domain.

20 Claims, 13 Drawing Sheets

METHOD AND SYSTEM FOR PROVIDING EFFICIENT ON-PRODUCT CLOCK GENERATION FOR DOMAINS COMPATIBLE WITH COMPRESSION

FIELD

The field of the invention generally relates to hardware and/or software verification of logic circuits and more particularly relates to a method and system for providing on-product clocks for a circuit with multiple domains that are compatible with test compression.

BACKGROUND

Modern electronic circuits and devices are integrated on a smaller surface and run at a frequency often exceeding 1 GHz to speed up logic transitions and data transfer. In order to detect manufacturing defects or flaws that occur at an operating frequency of the electronic circuits, these circuits and devices are tested at or near their operating frequencies, using so called at-speed clocks. It is exceedingly difficult and expensive to test electronic chips, integrated circuits, devices, and/or printed circuit boards using automated test equipment (ATE) that provide such high frequency clocks. Instead, high frequency clocks are often derived on-chip from a lower clock frequency by running one or more Phase-Locked Loop (PLL) circuits. For example, a relatively slow 100 MHz input clock from an oscillator supplied by an ATE or a test board is multiplied in frequency using a PLL to produce a 2 GHz output clock. The faster output clock is used to run state machines for testing logic circuits operating at different clock frequencies in a device under test (DUT) or logic under test (LUT).

To avoid hefty expenses and potential technical troubles for providing high-speed clocks in an ATE, a technique called on-product clock generation (OPCG) is utilized. OPCG domain logic passes through the functional clock as unmodified during normal operation, and provides test clock sequences during test operations. The OPCG domain logic multiplies input clock frequencies using one or more PLLs to generate high frequency clocks and divides the PLL output clock using clock dividers to generate a lower frequency clock to run other domains that do not run at the higher frequency of the direct PLL output. These clock signals generated from the PLL and/or the clock dividers are used to run state machines for each of the internal clock domains for the device being tested.

State machines for chip testing in a test application are programmable and run from an at-speed clock generated from OPCG domain logic (PLLs and optionally with clock dividers). Programming of these state machines is typically accomplished by including programming bits within test scan chains of the DUT. As each test's stimuli are loaded via test scan chains, the OPCG domain logic is loaded according to the programming bits via the test scan chains. However, typical state machines do not provide sufficient flexibility as to how the pulses are generated for each clock domain.

Programming a state machine that uses OPCG domain logic poses several problems. First, if a decompression logic circuit is used to load scan chains, the OPCG programming bits must be resolved from the test data that is pushed through the decompression logic. Decompression of the test data to resolve the OPCG programming bits consumes valuable bandwidth and requires additional 'care' bits that compete with the ATPG 'care' bits that are necessary when mapping automatic test pattern generation (ATPG) tests through the decompression logic. The OPCG programming bits may be forced into dedicated scan chains that are fed directly via separate scan-in pins to avoid competition for scan-in data bandwidth with ATPG care bits and/or other OPCG programming bits in other scan chains. This approach, however, requires additional scan-in pins and/or removes the bandwidth of the scan-in pins feeding just the OPCG programming scan chains from being used to load care bits for normal scan chains, which will have a direct impact on the overall compression efficiency by either making normal scan chains longer or by forcing more test patterns to be generated.

Secondly, when there are many internal clock domains that communicate with each other in some fashion, the uncertain and effectively asynchronous timing of the OPCG-generated clocks to different clock domains makes it very difficult, if not impossible, to deal with race conditions that occur when the clock domains that communicate with each other are clocked at the same time. To resolve these issues with race conditions, only one clock domain is typically pulsed at a time in any one test. Pulsing several clock domains in the same test may be allowed if those clock domains do not communicate with each other. Testing is more efficient when multiple communicating domains can be pulsed in a single test.

Many of today's sophisticated chip designs include multiple internal cores (e.g., processor, memory, I/Os) that run on different clock domains and frequencies. It is common to see chips with hundreds of internal clock domains. If a small number of clock domains are pulsed in each test, the number of tests needed to test the whole chip goes up exponentially, increasing the total cost for testing. Only a few clocks in each test may be pulsed to reduce the chance for delta-I noise caused by excessive switching, often called "simultaneous switching noise" on the power rails. The more domains pulsed simultaneously or nearly simultaneously, the more switching activity occurs, thus the higher is the chance for having switching noise in the power rails.

The various embodiments described herein propose new approaches for programming state machines that generate clock pulses for each internal clock domain.

SUMMARY

A method and system for providing on-product clocks for domains compatible with compression is disclosed. According to one embodiment, a computer-implemented method comprises receiving from automated test equipment (ATE) a base clock signal having a frequency for testing a plurality of clock domains and programming instruction for a first clock domain and a second clock domain of the plurality of clock domains. A first clock signal and a second clock signal are generated from the base clock signal based on the programming instruction. A first delay for the first clock signal and a second delay for the second clock signal are determined from the programming instruction. A test sequence is provided to test a first clock domain and a second clock domain. The test sequence comprises the first clock signal delayed by the first delay and the second clock signal delayed by the second delay. The first clock drives the first clock domain and the second clock derives the second clock domain. The programming instruction for the test sequence is loaded independently from normal scan test data for each test and is reloaded only when a new clock sequence is required.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiment given below serve to explain and teach the principles of the present invention.

Figure 1A:
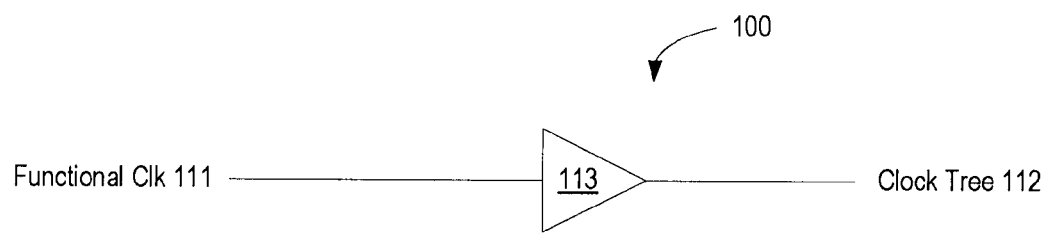
FIG. 1A illustrates a simplified clock domain diagram, according to one embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method and system for generating on-product clock pulses for high frequency testing of an integrated circuit with multiple domains that is compatible with test compression is disclosed. According to one embodiment, a computer-implemented method comprises receiving from an automated test equipment (ATE) a base clock signal having a frequency for testing a plurality of clock domains and programming instruction for a first clock domain and a second clock domain of the plurality of clock domains. A first clock signal and a second clock signal are generated from the base clock signal based on the programming instruction. A first delay for the first clock signal and a second delay for the second clock signal are determined from the programming instruction. A test sequence is provided to test a first clock domain and a second clock domain. The test sequence comprises the first clock signal delayed by the first delay and the second clock signal delayed by the second delay. The first clock drives the first clock domain and the second clock derives the second clock domain. The programming instruction for the test sequence is loaded independently from normal scan test data for each test and is reloaded only when a new clock sequence is required.

Each of the features and teachings disclosed herein can be utilized separately or in conjunction with other features and teachings to provide a method for reducing the order of system models exploiting sparsity. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

To test logic circuits of a user design, high-frequency clocks are generated using a slower frequency clock from an ATE or provided on a load board to test the device. One or more lower frequency clock signals are fed to one or more PLLs to produce higher-frequency clock signals. These high-frequency clock signals may be divided using clock dividers to produce lower frequency clock signals as needed. Each of the internal clock domains for the device under test is run in a test configuration by a state machine. The clock source of the state machine is provided by an external clock signal, the output of a PLL, or a divided down, lower frequency signal clock from one of the clock sources.

According to one embodiment, OPCG domain logics are provided for each independent clock domain of a user design. High frequency clocks for testing the internal cores and logic of the user design are generated by the OPCG domain logics and used to apply a set of clock pulses for use in automatic test pattern generation (ATPG) by running one or more state machines. The OPCG domain logic may be used to supply capture clock pulses for a logic built-in-self-test (LBIST) or even a memory BIST (MBIST) application. The high frequency clocks that are used to run the OPCG state machines may be alternatively provided by an internal or externally provided oscillator or an ATE running the test application.

An OPCG domain logic implementation includes a state machine that produces a pulse sequence when an externally provided trigger or run signal is given. The number of clock pulses that the state machine may produce is determined by the size of the pulse generator inserted into the design. The start of the first pulse emitted can be delayed by using an optional delay or down counter. After the pulse sequence is completed, the state machine quiesces, and the OPCG domain logic forces no further clock pulses to be emitted; the state machine is prepared to start another test application by toggling the trigger signal again, reloading and restarting state machine.

According to one embodiment, OPCG domain logic contains programmable parameters to adjust the level of complexity of a test application and/or the number of clock cycles to run a state machine. The OPCG domain logic may generate no pulses if programmed so. An OPCG is programmable via a programmable parameter that determines the number of clock pulses to emit from the state machine to a clock domain. The maximum number of clock pulses that a domain may emit is determined when the OPCG domain logic is configured into the design. Typically, the OPCG program loading sequence that initializes the state machine determines the specific number of clock pulses to be applied for a specific test, but toggling the trigger signal multiple times from the ATE that runs the test application may increase the number of clock pulses emitted by the state machine for any one test application by running the programmed capture clocking sequence multiple times. For example, if domain A is programmed to emit two pulses, the application of the trigger toggle twice emits a total of 4 pulses into domain A.

Another parameter may be included to establish the size of a delay counter that determines the time delay of the start of the programmed pulses after receiving a trigger signal. The delay counter may be implemented by a down counter whose initial value is set by the number of clock pulses and decremented at each clock pulse. If the size specified for the counter is zero (0), no counter is included or used in the state machine. The delay counter may operate at the frequency of the oscillator that drives the clock domain, at a higher frequency derived from the PLLs of the OPCG domain logic, or at a lower frequency by dividing the domain oscillator source by using a clock divider.

According to one embodiment, a programming register bit may configure the pulse chain shift register to emit a continuous stream of pulses until the trigger signal is de-asserted. Such a free-run enable for a domain clock may be useful to run logic and/or memory BIST controllers at speed.

According to one embodiment, a delay counter of OPCG domain logic allows pulsing multiple clock domains that communicate with each other in a single test application and avoids inter-domain race conditions by delaying pulses on domains that communicate with domains pulsed earlier or later in the test. For example, the delay counter provides a sufficient delay to ensure no inter-domain race conditions between the clock domains that are clocked within the same test application.

According to one embodiment, a domain state machine contains one or more serially programmed registers. Some of these programming registers have an execution register that is loaded in parallel from the associated serially loaded programming register upon receiving a reset signal (e.g., signal 134 in FIG. 10). The types of such program and/or execution registers include, but are not restricted to, pulse train generation by gating of a free-running oscillator, delay counters, free-run mode enable, domain input blocking and domain clock gate blocking.

According to one embodiment, OPCG domain logic is programmed using one or more programmable registers to run in a 'normal scan chain' mode or a 'side-scan chain' mode. In a normal scan chain mode, the programmable registers are connected to the OPCG domain logic and loaded along with normal scan chains. To apply the same clocking sequence multiple times on consecutive tests, the programmable registers are reloaded to their desired state via a normal scan chain load operation for each test application before the corresponding test starts and launches the clocking sequence by asserting a trigger signal.

In a side-scan chain mode, the programmable registers are connected to a side-scan chain that is loaded separately and independently from normal scan chains. The side scan chain may be reloaded to reprogram the OPCG domain logic, for example, to start a new test clocking sequence. Once loaded by a side-scan operation, the programming bits within the side-scan chain hold their values until they are reloaded by another side-scan load operation. The programming bits within the side-scan are not part of the operational circuit that produces pulses or adds delay. In a side-scan chain mode, a reset input is provided to denote when a serially loaded programmed value is copied into a functional register.

Functional registers may get corrupted by the application of the test when a trigger signal is received. For example, upon receiving the trigger signal, the trigger processor outputs a reset signal that causes a delay counter (902 in FIG. 9) to be loaded from the program register (901 in FIG. 9) to the programmed value; the delay counter decrements to zero during the test application, thus it must be reloaded by a reset input on each test application. These programmable functional registers that are serially loaded by a side-scan chain maintain their loaded values until the next load operation. They are copied into the active registers where appropriate. Corrupted (active state machine) registers include a delay counter (902 in FIG. 9) and a clock gating pulse chain shift register (903 in FIG. 9).

For example, a four bit clock gate shift register might be loaded with binary 0110 so as to produce 2 pulses for a given programming. Each 1 bit represents a pulse to be emitted into the domain's clock tree at the root of the clock tree. The right-most bit of the register gates the oscillator that runs the domain's state machine such that a value of zero produces no pulse and a value of one produces a pulse. This shift register, once activated, shifts its values to the right after each pulse and simultaneously shifts a value of zero into the left-most bit so that the shift register will eventually contain all zeros (0000) which will gate off all subsequent pulses from getting to the domain's clock tree root. If a free-run program bit is included, the value of that bit is shifted into the left-most bit of the clock gate shift register on each cycle once the state machine has been enabled to emit pulses. To apply the same test again, the shift register must be restored to the values programmed for it (0110 in this example) so there will again be 2 pulses emitted. Similarly, a delay down (or up) counter might be loaded with a starting count that would change once the state machine starts running. When the counter reaches its terminating state, it signals the pulse generating shift register to start shifting and producing its programmed pulse stream. The delay counter will also need to be restored to the starting count value (via a reset) so the next test will operate the same as the last one without having to serially re-load the programming registers.

According to one embodiment, a state machine including a delay counter runs off an oscillator input clock. The oscillator input clock may be sourced from a PLL output, possibly divided into a lower frequency clock than the raw PLL clock output. A divider circuit may be added to a user's design for testing if the user's design does not have one in it for functional use. Alternatively, an existing functional clock divider may be used without having to add one to the design just for test purposes. The divider circuit may be fixed in terms of the integer divide amount it provides, or it may be programmable using one or more programmable registers. The programmable registers are set (or reset) during the test mode initialization. Alternatively, it could be loaded as part of the clock sequence programming since changing the clock divider does not require the PLL be relocked.

PLLs typically require a number of input reference clock cycles to be seen before the PLL output can be considered valid to be used as a clock source. The process of applying a number of input reference oscillator cycles until valid PLL output occurs is referred to as waiting for the PLL to "lock" onto the input reference frequency and phase. Some PLLs provide an output "lock" signal to explicitly denote when PLL lock has occurred. Because PLL locking often takes thousands of reference clock cycles to occur, it is important for PLL lock to occur as part of the test mode initialization in which test patterns are applied. If the PLL is reprogrammed, the wait for locking occurs again to ensure valid and repeatable results.

According to one embodiment, the divider circuits have a reset input to ensure that all oscillator outputs used to run the clock domains have a known phase relationship from the reset and run signals brought about by the trigger signal edge. Without a reset input, problems arise when the various divider circuits may be at their internal counting states when the Run signal 135 appears at their clock domain controller inputs. The more uncertainty there is in timing of the first clock pulse for each domain, the more safety margin must be allocated to account for the earliest and latest possible clock timings that may occur in order to avoid potential race conditions that may intermittently fail the test.

According to one embodiment, programming bits are provided to each clock domain that is run by OPCG domain logic. The programming bits are preferably loaded from an ATE via so-called side scan chains that are loaded separately from the normal scan chains. When these side scan chains have been loaded, the values within them represent the values programmed in the OPCG programmable functional registers and they stay fixed to these values until re-loaded. The OPCG programmable functional registers are loaded via separate scan chains in a manner so as not to disturb the values held within the normal scan chains. The OPCG programmable functional registers program the OPCG domain logic accordingly by initializing the OPCG domain logic for a test application upon receipt of a reset clock pulse. The delay counters are loaded by copying from the programmable registers during the reset clock to establish when each domain will begin to emit pulses. The pulse generating clock gating shift registers that determine the number of clock pulses to be emitted by each domain are also set by copying their content from the corresponding programmable register. The programmed registers loaded by a side scan chain mechanism remain unchanged until a different clocking sequence is programmed by providing a different set of programming bits on the side scan chain.

When a new clocking sequence needs to be used, the ATPG generates a sequence of events to load a new program into the OPCG registers. Compared to the conventional OPCG programming technique that programs the OPCG domain logic for each and every test by including the OPCG programming registers within the normal scan chains, the programming technique using side-scan chains used herein reduces the bandwidth needed for programming the OPCG domain logic (See FIGS. 13A-13C). For example, the bandwidth requirement for loading OPCG programming bits and programming the OPCG logic is reduced by a factor of 100 when the clocking sequence changes on average after 100 tests are applied with any single clocking sequence within the entirety of the total set of tests to be applied to the design. In addition, the programming bits are loaded from side scan chains so that they do not have to be resolved through a decompression logic, through which normal scan chains' data is resolved when using test compression logic. In other words, programming bits do not compete with each other and/or ATPG care bits for scan-in data bandwidth. Because OPCG programming bits are loaded separately from the normal scan chains, they may be loaded via all available scan-in pins, reducing the number of shift cycles required to load a new clocking sequence program. As a result, the test throughput and the effectiveness of test compression are improved. For a design with a few tens of clock domains or more (e.g., network communication devices), the programming technique using side-scan chains greatly reduces the data bandwidth required for loading individual tests. The more independent clock domains that are included in a design, the more programming bits are loaded for programming them. Some designs, such as network communication devices, have hundreds of independent clock domains.

According to one embodiment, the number of test patterns generated from an ATPG and applied to a user design is reduced by employing multiple clock domains pulsed per each test sequence. Employment of multiple clock domains in a test sequence typically complicates prediction of a test result due to race conditions that may exist along paths between any of the clock domains being exercised in the test. Race conditions may be avoided by not simultaneously pulsing multiple clock domains that communicate with each other. To that end, a delay mechanism is implemented in a state machine to generate clock pulses for each clock domain.

The delay mechanism may be provided in a number of ways. In one embodiment, a down (or up) counter is used. When receiving a run signal from the trigger signal processor to fire their clocks, each of the clock domains counts the programmed value prior to emitting pulses to its clock tree. For example, clock domain A's flops feed clock domain B's flops. After pulsing clock domain A, the test waits for domain A clocking to quiesce before starting to pulse clock domain B. This delay mechanism allows pulsing clock domains A and B in the same test but with a delay between them. By avoiding simultaneous pulsing of clock domains A and B, inter-domain race conditions are avoided. The delay mechanism that enables employing multiple clock domains in a test sequence reduces the number of tests required to fully test a design. The test time is reduced and consequently so is the test cost. Insertion of a delay between the firing of the internal clock domains improves the efficiency of the test and helps to reduce the chance of simultaneous switching noise even when the clock domains do not communicate with each other. Simultaneous switching noise that may impact yield is reduced by skewing the clock pulses on different domains (via delay counters) such that less logic is switching at the same instant in time.

The use of counters to delay the firing of clock pulses for at-speed testing may increase the overhead for the OPCG domain logic. The extra overhead of the counters may be minimized by selectively and optimally using them in the clock domains. For example, within any test clocking sequence, the clock domains without delay counters are always clocked prior to those with delay counters so that the counters can be used to delay those domains from firing too close to the domains that have no delay counter. A typical user design contains several million flops. If the user design has 2 million flops with 100 clock domains and requires 5 bit counters for each clock domain, an additional 1000 flops (one flop per each counter bit within the counter and a second flop to hold the serially loaded value during programming) are added the user design. The overhead due to the counters account for a very small fraction of the user design, in the present example, less than 0.05%. Even if each clock domain contains a counter, the overall overhead is in the range of 0.05% of the total flops. The counters to implement a delay mechanism in OPCG domain logic add minimal overhead to the user design.

For a user design containing many internal clock domains (e.g., tens to hundreds of internal clock domains), these clock domains may communicate with each other. Any cross-domain communication paths may interfere with testing because of the timing issues. The high speed clocking is desirable for intra-domain testing, but the timing of clocks running different domains is intrinsically asynchronous and there is no good way to synchronize them in general. In order to reduce the test time, many clock domains are tested in parallel if possible, taking timing, power and race conditions into account. A worst case scenario is to find that all clock domains communicate with each other and only one clock domain per test sequence is used to avoid race conditions. One approach to allow clocking two or more domains (in a single test) that communicate with each other is to block the cross-domain communication paths therebetween. Techniques for blocking cross-domain communication paths between cross-domains are well known. It is reasonable to include a domain blocking control if the extra overhead to block such paths is acceptable. However, those cross-domain paths cannot be blocked when attempting to test those paths between the domains.

The delay mechanism inserted in the OPCG domain logic avoids race conditions of multiple clock domains in a test sequence and enables testing of multiple clock domains in the same test sequence. For example, a user design contains three internal clock domains, A, B and C that cross-talk with each other along specific paths, and domains A, B, and C run at 1 GHz, 500 MHz, and 333 MHz, respectively. Without a delay mechanism, each domain A, B, and C would be tested in a separate test sequence requiring three test sequences to run. Instead of running three separate test sequences, the delay mechanism allows to pulse and test each domain A, B, and C in a single test sequence. Suppose each domain A, B, and C needs to be pulsed twice to complete a test. In one embodiment, domain A emits two consecutive pulses immediately after a trigger without delay and quiesces; domain B waits four cycles of its own clock (500 MHz) and emits two consecutive pulses and quiesces; domain C waits ten cycles of its own clock (333 MHz) and emits two consecutive pulses and quiesces. The domains A, B, and C are pulsed in the same test sequence, separated by delays to avoid race conditions.

The total run time of the test sequence pulsing all domains A, B, and C is increased minimally (e.g., 10 cycles of a 333 MHz clock or 30 ns) by combining clocks in a single test sequence that would otherwise require three test sequences, each of which test domain A, B, and C, respectively. The internal delays in the test sequence between pulsing of each domain add (e.g., 30 ns) to the run time of the test sequence compared to pulsing just one of the domains, however, the overhead due to the internal delays is minimal, for a typical user design, in the neighborhood of a few tens of nanoseconds. This is insignificant compared to the whole run time of a single test sequence, typically in the range of 10 to 1000 microseconds. By comparison, running three separate test sequences (one for each clock domain) in this example takes more than three times longer than a single domain test with additional delay added to allow multiple domains to fire in a single test. The test time saving is even more significant when there are hundreds or thousands of clock domains involved.

FIG. 1A illustrates a simplified clock domain diagram, according to one embodiment. Clock domain root 100 receives a functional clock signal 111 from a source. The output of buffer 113 is a pulsed functional clock signal that drives one or more clock domains in clock tree 112 for functional operation.

Figure 1B:
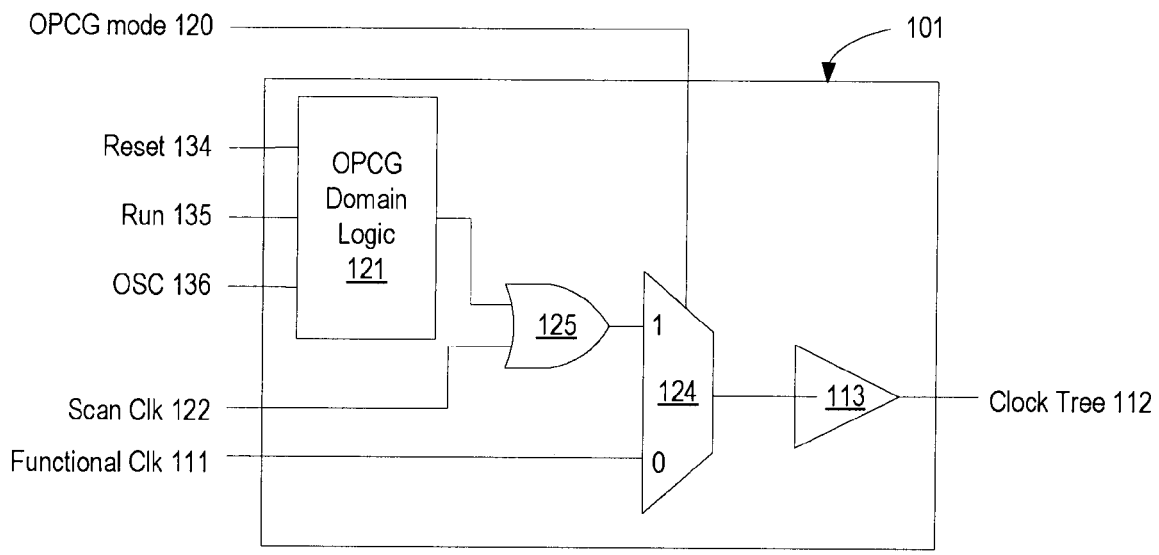
FIG. 1B illustrates an exemplary clock domain diagram incorporating OPCG domain logic, according to one embodiment.

FIG. 1B illustrates an exemplary clock domain diagram incorporating OPCG domain logic, according to one embodiment. Clock domain root 101 incorporates OPCG domain logic 121 and receives OPCG mode signal 120. OPCG mode signal 120 selects between testing the circuits in the user design, including the scanning of the test data into the design and responses out of the design, as well as its functional operation. When OPCG mode signal 120 is de-asserted, mux 124 selects the pulsed functional clock signal to drive clock tree 112. When an OPCG mode is asserted (OPCG mode signal is set to 1), clock tree 112 is driven by either OPCG domain logic 121 or scan clock 122 via OR gate 125. Clock tree 112 is used to supply both the scan clocking as well as the launch and capture clocking that typically appears between scan shift operations. Because OPCG generated clock 121 is OR'ed with scan clock 122, both OPCG clock 121 and scan clock 122 are at logic zero (0) at the input to OR gate 125 when they are not being pulsed/used—enabling the other input to the OR to be used.

Functional clock 111 may be generated on-product from a PLL or in various manners appropriate for functional operation. Scan clock 122 is used when functional clock 111 is not available for use during a test or there is no ATE-sourced test clock input driving functional clock 111. A test clock primary input provided by an ATE is required to allow the ATE to clock the scan chains for loading test stimuli and unloading test responses, with or without test compression employed within the scan load and unload areas of the design. Internal registers in the user design are connected in one or more scan chains for loading test patterns and unloading test results using scan clock 122. The test results are scanned out (unloaded) by the one or more scan chains and compared with the expected results of a "good circuit."

OPCG domain logic 121 receives reset signal 134, run signal 135 output from a trigger processor (311 in FIG. 3), and OSC signal 136 output from a PLL, or a divided-down PLL output, or directly from the ATE. Reset signal 134 is used to reset a counter of a state machine and/or internal functional registers of OPCG domain logic 121. Run signal 135 starts the state machine after a reset. OSC signal 136 is a free-running oscillator signal that runs at or close to the domain's operating frequency to enable at-speed testing. The output from OPCG domain logic 121 is OR'ed with scan clock 122 by OR gate 125. When the OFF state for OPCG domain logic 121 is logic zero (0), scan clock 122 is used. When scan clock 122 is OFF state, OPCG pulses generated by OPCG domain logic 121 are used.

Figure 2:
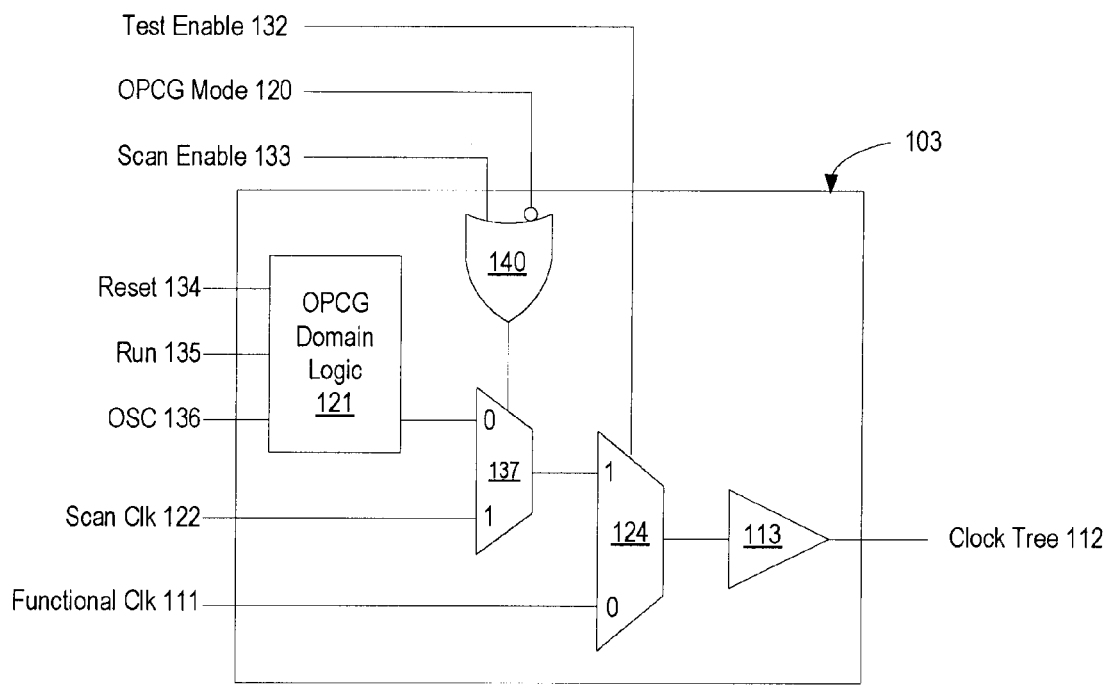
FIG. 2 illustrates another exemplary clock domain diagram incorporating OPCG domain logic, according to one embodiment.

FIG. 2 illustrates another exemplary clock domain diagram incorporating OPCG domain logic, according to one embodiment. Scan clock 122 is multiplexed with the output from OPCG domain logic 121 using multiplexor 137. In this exemplary implementation, the output of OPCG domain logic 121 can be either one (true) or zero (false) when quieced as long as it matches the clock OFF state value of scan clock 122 at the input to the multiplexor 137. In a test mode, clock domain root 103 receives scan clock 122 and the output of OPCG domain logic 121 from multiplexor 137 under control of test enable signal 132 that is received from an automated test equipment or from a test control register loaded prior to a test application. When the test runs in an OPCG mode, OPCG mode signal 120 is asserted from a test or a test control register allowing scan enable signal 133 to control the output of OR gate 140. The output of OR gate 140 selects scan clock 122 when scan enable 133 is high (1) and the output of OPCG domain logic 121 when scan enable 133 is low (0) for driving clock tree for domain 112. When OPCG mode 120 is de-asserted (0), the output of OR gate 140 is fixed to one and forces only scan clock 122 to drive domain clock tree 112, and OPCG domain logic 121 is bypassed.

As compared with the embodiment shown in FIG. 1B, there is no requirement that OPCG logic 121 and scan clock 122 be at logic value zero (0) when those clock sources are not being used (i.e., when they are off). Clock domain root 103 requires that the OPCG output and scan clock 122 have the same OFF state (zero or one) in which they stay while the other clock source is being used. The OPCG domain logic 121 assumes a quiesced (off) state when it is done outputting pulses to the clock tree 112 and stays in this state until the next assertion of the trigger signal is applied to the design. It is important that the output of OPCG domain logic 121 and scan clock 122 have the same value at the input to Mux 137 so that no clock transition is sent down clock tree 112 when the scan enable signal 133 is switched either to scan state or out-of-scan state. The insertion of an inverter on either input to Mux 137 ensures that the off states of the OPCG and scan clocks match. The insertion of an inverter after the Mux 137 forces the clock off state to either be 0 or 1 at the domain root and does not affect the operation of the OPCG logic.

Mux 137 is a 2-to-1 multiplexer that must avoid emitting glitches when its select input—(fed by the output of OR gate 140)—changes and both data inputs are at the same off state. Mux 137 may be replaced with an OR gate when the clock OFF states for both scan clock 122 and the output from OPCG domain logic 121 are zero, as is shown in FIG. 1B.

Test enable signal 132 is used to select between the functional mode (Test Enable=0) and the test mode (Test Enable=1). When operating in the test mode, the OPCG Mode signal 120 selects between scan clock 122 (OPCG Mode=0) and OPCG domain logic 121 (OPCG Mode=1 and Scan Enable=0) being used to supply launch and capture clocks. When operating in the OPCG mode, scan enable signal 133 selects between scan clock 122 (Scan Enable=1) and the OPCG clock 121 (Scan Enable=0). When operating in the OPCG mode, reset signal 134 resets any state machine elements within OPCG domain logic 121 prior to run signal 135 being asserted to run the state machine to cause OPCG domain logic 121 to emit the pulses as programmed to produce. OSC signal 136 input to OPCG domain logic 121 is the oscillator clock used to run the state machine elements within OPCG domain logic 121. OSC signal is typically sourced from a PLL and is free-running once the OPCG mode has been established, but it can be gated off whenever run signal 135 is low (0).

Figure 3:
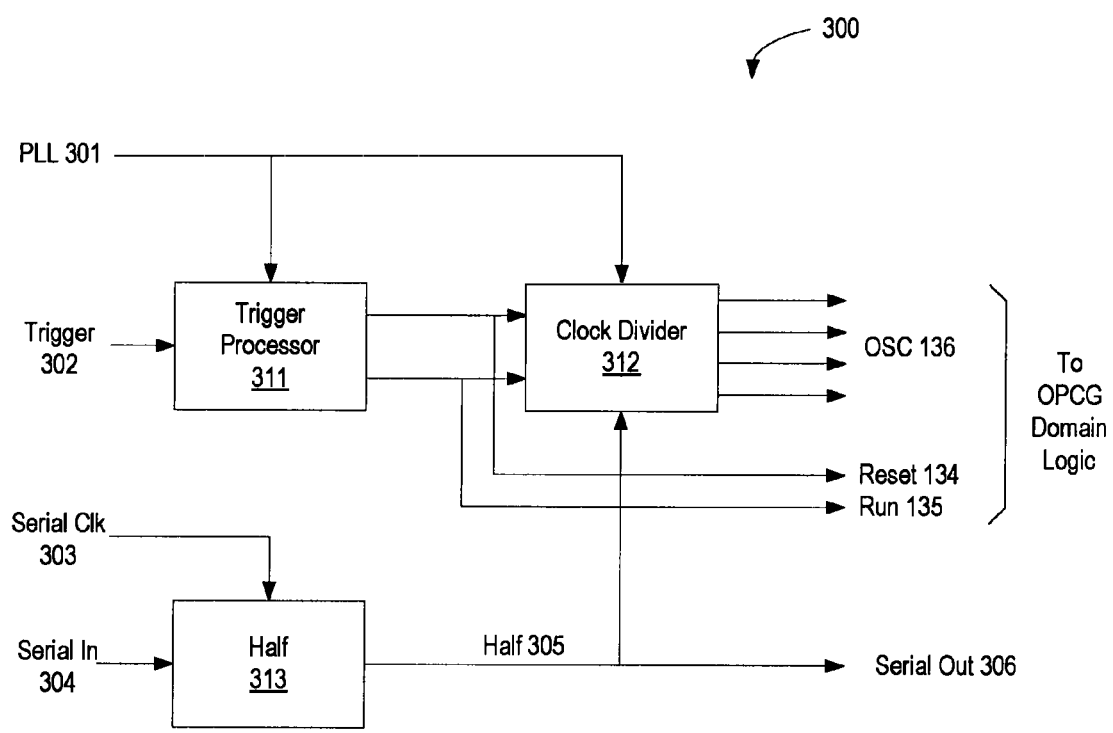
FIG. 3 illustrates an exemplary controller logic of an OPCG circuit, according to one embodiment.

FIG. 3 illustrates an exemplary controller logic of an OPCG circuit, according to one embodiment. The controller logic is implemented within the design to be tested, and the design includes at least one controller 300 for an OPCG operation. The controller connects between the PLL(s) of the design and the OPCG domain logic 122 and also is connected to a trigger signal primary input. Controller 300 includes trigger processor 311 to direct the OPCG domain logic instances in the design when to reset and when to run their programs. PLL signal 301 is an output free-running oscillator clock from a PLL circuit and serves as a basic clock signal for running the controller logic and may be used to drive one or more clock domains' OPCG domain logic 121. The test machine running the test sends an asynchronous trigger signal 302 to trigger processor 311. Trigger processor 311 runs a state machine implemented therein clocked by PLL 301 and emits reset signal 134 and run signal 135. Clock divider 312 also receives the reset signal 134 (and optionally run signal 135) from trigger processor 311 and provides appropriate OSC clocks 136 to drive each of the coupled clock domains.

At the start of an OPCG clocking sequence using the OPCG programming bits that are previously loaded, trigger processor 311 sends reset signal 134 to the clock dividers 312 and domain state machines of OPCG clock domain 121 and follows reset signal 134 with an assertion of run signal 135 after a few PLL cycles. The clock dividers 312 may reset to a known starting state for each test while each clock domain's state machine uses reset signal 134 to perform a copy operation from serially loaded programming registers into functional operation registers. This includes clock gate shift registers and any delay counters that may exist for any clock domains. The clock gate shift register selects the number of pulses to emit. A delay counter determines how many domain cycles to delay emitting pulses after receiving the run signal.

For example, a user decides to create OPCG macros for six internal clock domains all to be run from a single PLL on the chip. The main input oscillator frequency from a tester is 100 MHz. The clock frequencies of the six clock domains are 2 GHz, two 1 GHz, two 500 MHz, and 250 MHz. The highest frequency 2 GHz is obtained from the direct PLL output from a 20× multiplier derived from the 100 MHz frequency of the tester input oscillator. Clock dividers of 2, 4, and 8 provide the clock domain frequencies of 1 GHz, 500 MHz, and 250 MHz that are needed for the other 5 domains from the 2 GHz PLL output.

At the start of a test, the ATE asserts trigger signal 302, trigger processor 311 sends a pulse on reset signal 134 resetting both clock dividers 312 and OPCG domain logic 121 to prepare to generate OPCG domain pulses. If any clock domains include a delay counter that was programmed to delay the output of pulses into the clock domain, the delay counter functional register is loaded from the program register upon receipt of reset signal 134 and begins counting upon receipt of the run signal 135. A few PLL cycles after issuing reset signal 134, trigger processor 311 asserts run signal 135. If there is no delay counter or if the delay counter is programmed to count zero cycle, the pulse generator (e.g., 903 in FIG. 9) of OPCG domain logic 121 begins to emit pulses as programmed upon receiving run signal 135. If there is a delay programmed for OPCG domain logic 121, run signal 135 sent from the delay counter to the pulse generator is delayed (signal Delayed Run 1120 in FIG. 11) until the counter expires and then the pulse generator starts emitting a series of pulses as programmed. In a preferred embodiment, trigger signal 302 runs all clock domains that are driven from a single PLL (possibly through a divider) or other clock source. It is possible that trigger processor 311 sends reset signal 134 and run signal 135 to the clock domains clocked by other clock sources, however it is preferred that a separate trigger processor 311 is used for each independent PLL and/or clock sources.

A delay test sequence is run by asserting trigger signal 302 (or run signal 135) to OPCG domain logic 121. Trigger signal 302 is sourced from a tester that initiates the test sequence. According to one embodiment, trigger signal processor 311 removes glitches on trigger signal 302. While the primary test input trigger signal pin is switching, multiple transitions or glitches on the signal are ignored, waiting for the signal to hold its activating value across multiple cycles of the PLL output. Removing glitches improves the predictability of the resulting timing.

According to one embodiment, OPCG domain logic 121 is implemented by a common macro such that the associated clock domains are driven from OPCG domain logic 121 using instances of the same macro logic. The clock domains that have different requirements for clocking may utilize different macros that have different functionality. There may be a single trigger signal processor 311 in a design or multiple trigger signal processors 311 may be used to run the clock domains. In the latter case, each trigger signal processor 311 may instantiate the same macro logic for processing trigger signal 302.

According to one embodiment, half speed control program bit provides a slower OPCG pulse generation at a half the normal pulse rate for ease of debugging. Half logic 313 is optional and may be provided in a separate circuit or included in OPCG domain logic 121 as an OPCG program bit. Programming bit of half logic 313 is loaded via serial in 304 at the frequency provided by serial clock 303. Serial output 306 is connected to another programming register's serial input to concatenate all programming bits into longer scan chains. When the programming bit of half logic 313 is programmed to zero (0), all clock dividers and domains run at normal (at-speed) frequency. When the programming bit of half logic 313 is programmed to one (1), the dividers and domains run at half their normal frequency.

Figure 4:
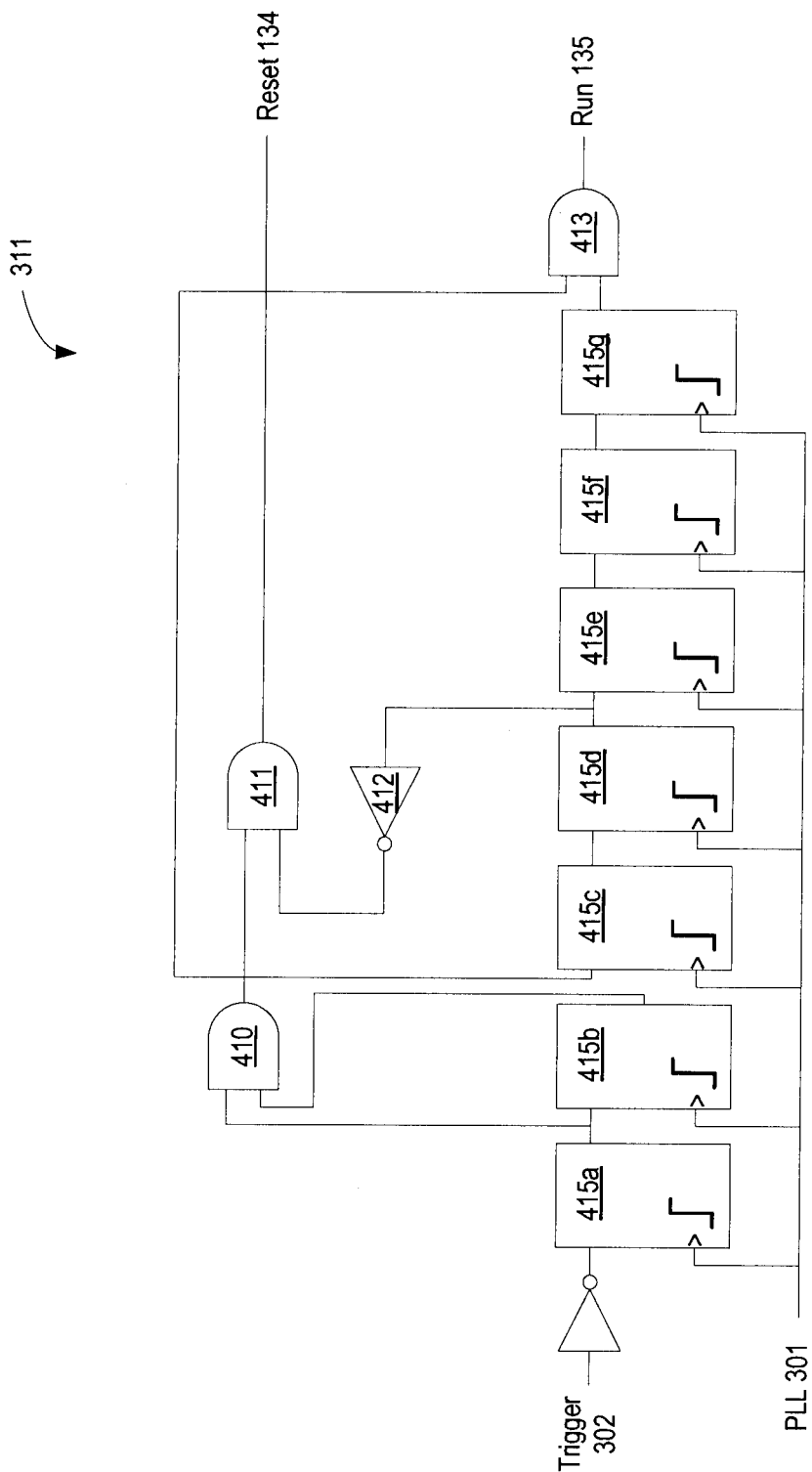
FIG. 4 illustrates an exemplary trigger signal processor, according to one embodiment.

FIG. 4 illustrates an exemplary trigger processor, according to one embodiment. Trigger processor 311 includes seven flip-flops 415 (also referred to as flops hereinafter) are connected in series—seven in this example. The first two flops 415a and 415b provide a delay to eliminate glitches in trigger signal 302. Additional delay and glitch protection can be obtained by inserting more flops between 415a and 415b and including their outputs into AND gate 410. The next two flops 415c and 415d along with inverter 412 and AND gate 411 generate a pulse on asynchronous trigger reset signal 134. Flops 415e, 415f, and 415g provide a delay between the end of reset signal 134 and the assertion of run signal 135. PLL signal 301 runs the state machine of trigger signal processor 311. PLL signal 301 may be the output of a PLL or an oscillating reference signal applied to a device input.

Figure 5:
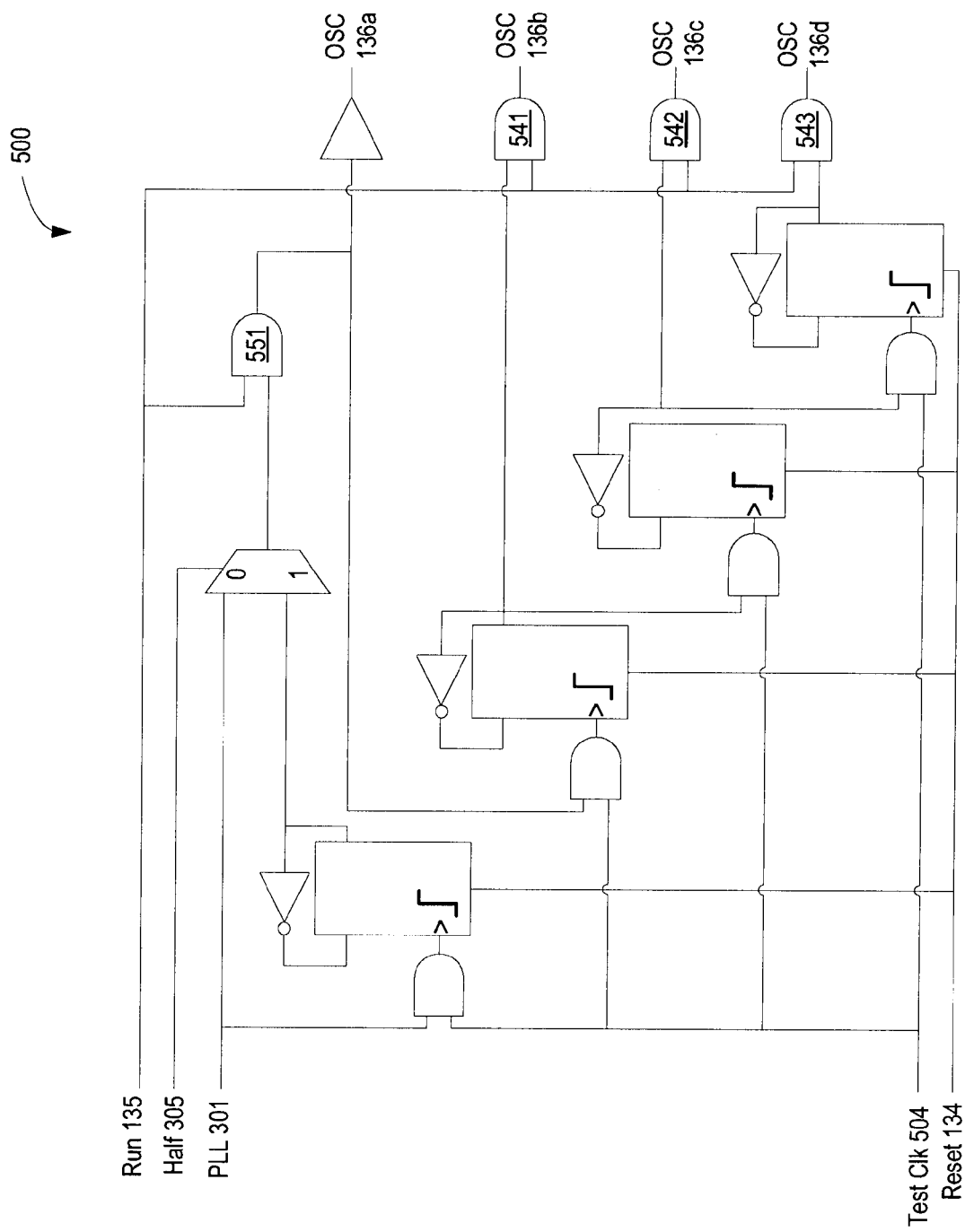
FIG. 5 illustrates an exemplary clock divider by powers of 2, according to one embodiment.

FIG. 5 illustrates an exemplary clock divider by powers of 2, according to one embodiment. Clock divider 500 supports clock division by powers of 2 from 2 through 8. Clock divider 500 can be easily extended to provide dividers for powers of 2 above 8. With half input 305 at zero (0), output 136a is the full frequency of input PLL 301, output 136b is half this frequency, output 136c is ¼ and output 136d is ⅛ of the frequency of input PLL 301. With half input 305 at one (1), these outputs 136a-136d have frequencies half their normal speeds. Half input 305 is optional and may be used to aid in debugging timing errors. The use of run signal 135 within clock divider 500 is optional and in this example gates the outputs so that they all fall to zero (0) when run signal 135 is not asserted. Without run signal 135 gating, gates 551, 541, 542 and 543 drop out. Test clock 504 is an optional input that allows clock divider 500 to be tested in a non-OPCG test mode of operation, when the PLL 301 is not running. In an OPCG test mode, test clock 504 is set to one (1).

Figure 6:
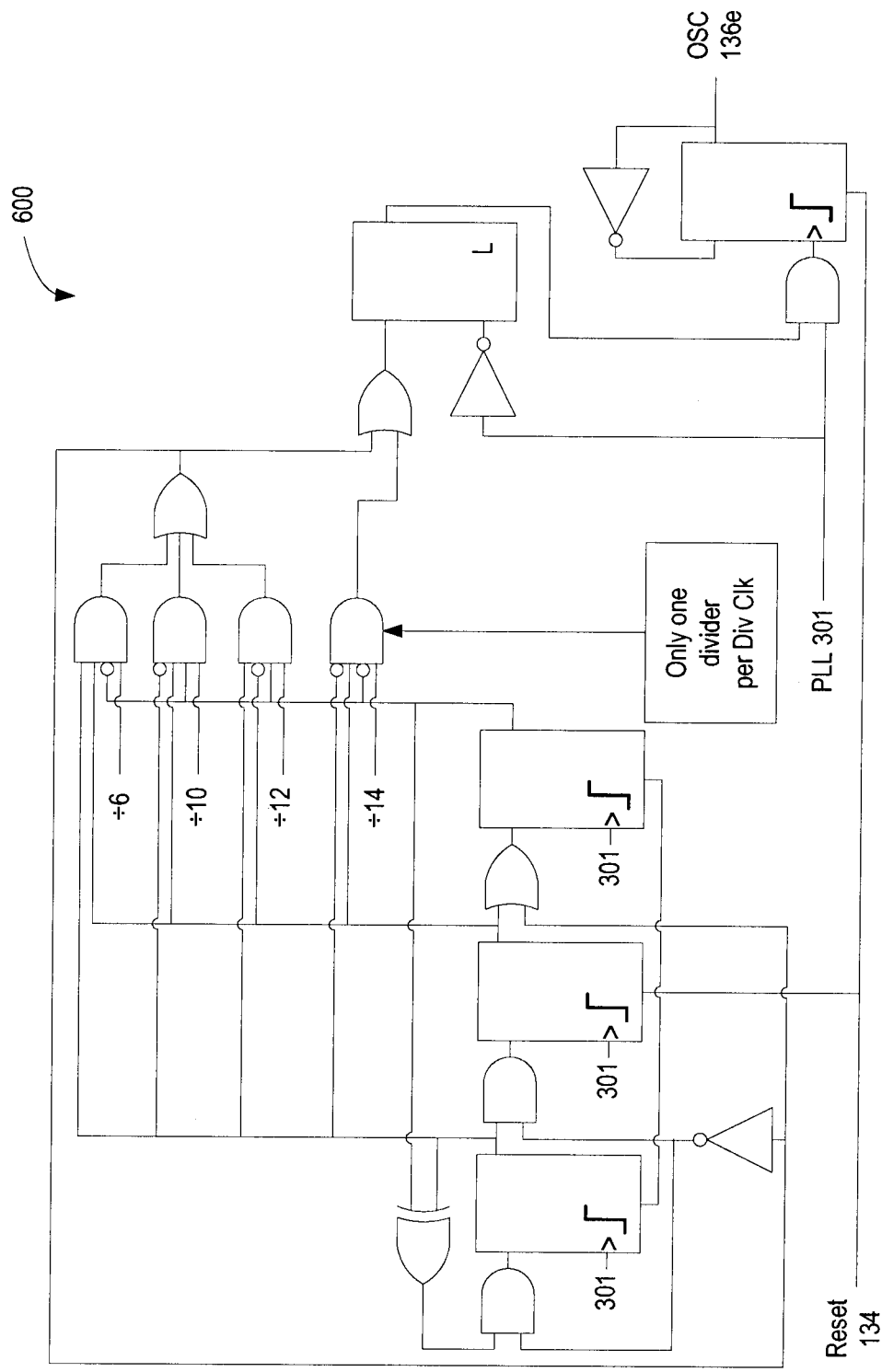
FIG. 6 illustrates an exemplary even divider, according to one embodiment.

FIG. 6 illustrates an exemplary even divider, according to one embodiment. Clock divider 600 supports even clock division, for example, dividing the frequency of PLL clock 301 by factors of 6, 10, 12, or 14. Even number clock division by powers of 2 is more easily handled using clock divider 500 of FIG. 5. Clock divider 600 may be hard-wired to a specific divide value by setting one of the signals ÷6, ÷10, ÷12 or ÷14 to logic 1 and the others to logic 0. Output clock 136e is ⅙, ⅒, 1/12 or 1/14 the frequency of the input PLL clock 301.

Alternatively, these signals can be sourced by serially loaded programming bits to make the divider programmable.

Figure 7:
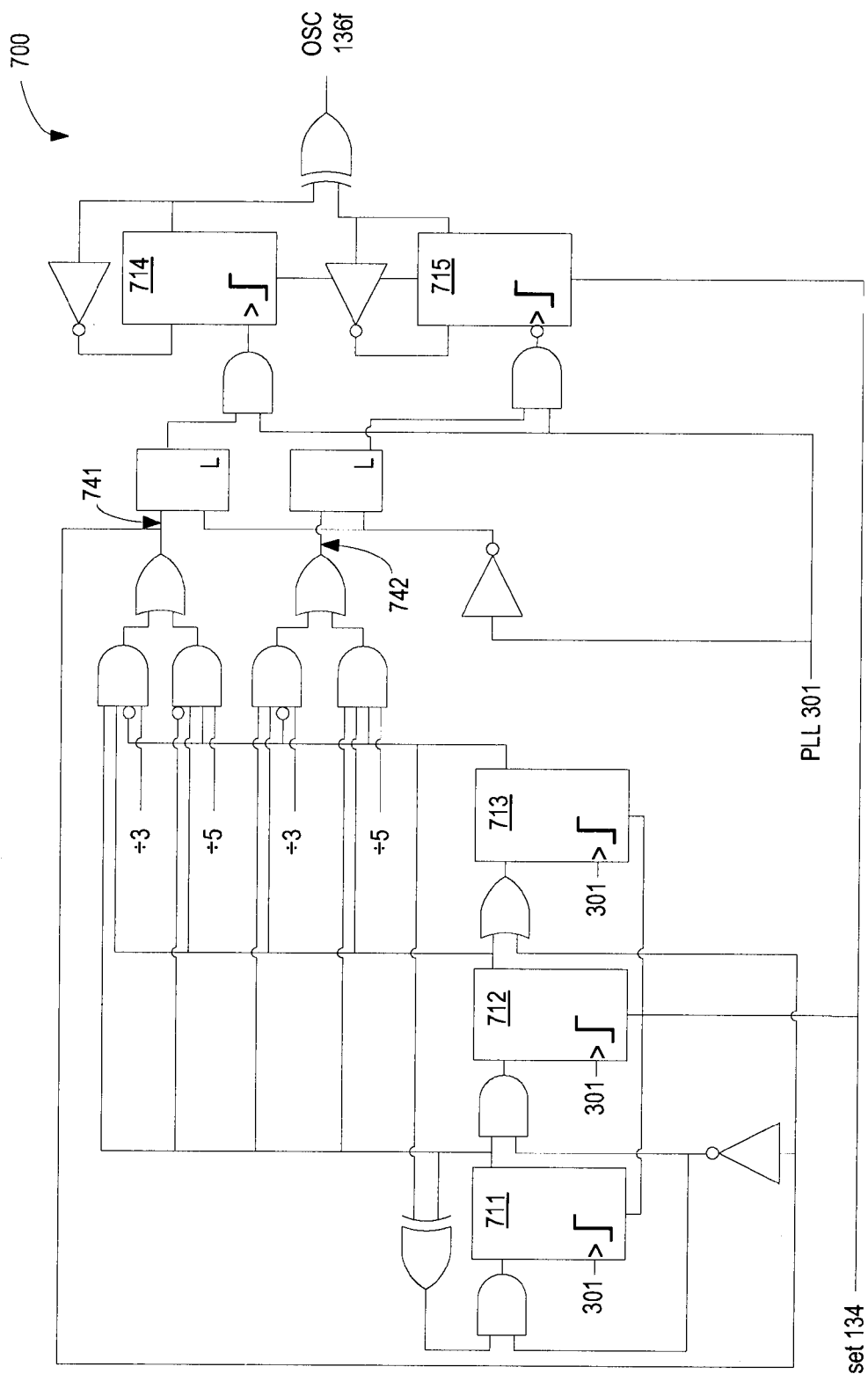
FIG. 7 illustrates an exemplary odd divisor, according to one embodiment.

FIG. 7 illustrates an exemplary odd divider, according to one embodiment. Clock divider 700 supports odd clock division, in this example, 3 or 5. Clock divider 700 may be hard-wired to a specific divide value by setting one of the signals ÷3, or ÷5 to logic 1 and the other to logic 0. Out clock 136f is ⅓ or ⅕ the frequency of input clock 301. Alternatively, these signals can be sourced by serially loaded programming bits to make the divider programmable. Division by higher odd numbers may be implemented by an extension of the clock division logic of FIG. 7 using a larger linear feedback shift register (flops 711-713).

Figure 8:
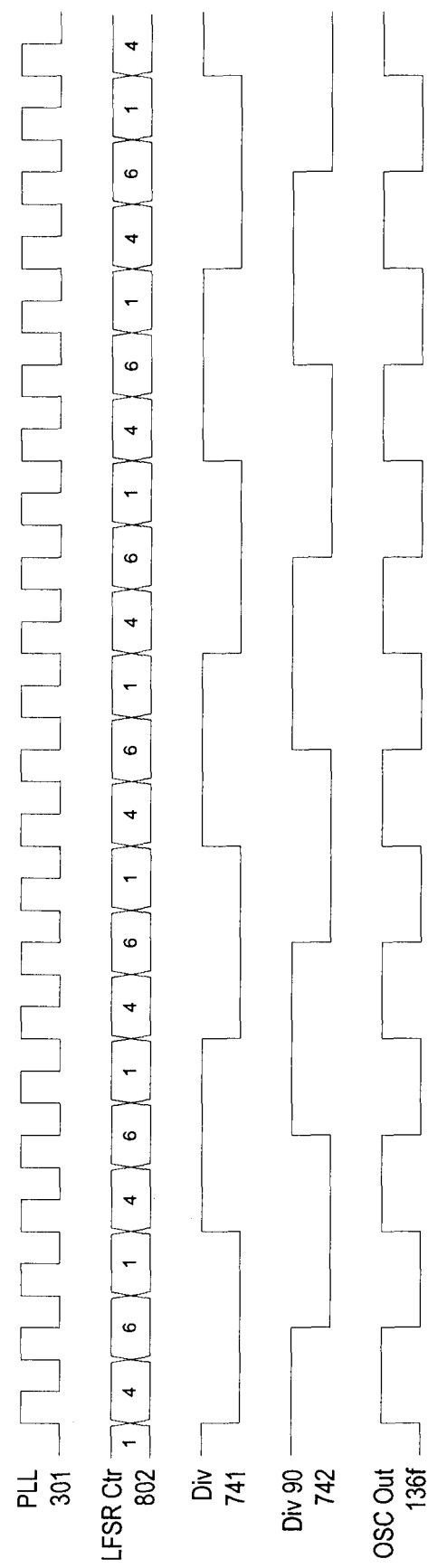
FIG. 8 illustrates an exemplary waveform for odd divisor by 3, according to one embodiment.

FIG. 8 illustrates an exemplary waveform of an odd divisor by 3, according to one embodiment. Input clock 301 is divided by three as shown by output clock 136f. Linear feedback shift register 802 repeatedly counts 4, 6, and 1 in response to input clock 301. At the end of counting 1, division signal 741 changes its state (0 to 1 or 1 to 0) generating a signal that is a division of PLL signal 301 by 6. Division signal 741 is shifted by 90° generating division 90 signal 742 and commutated to generate output clock 136f. The states of flops 711, 712 and 713 are shown as a binary value waveform LFSR Ctr (802). The outputs of flops 714 and 715 are shown as signals Div (741) and Div 90 (742). Output clock 136f represents the PLL clock 301 divided by 3 in frequency.

Figure 9:
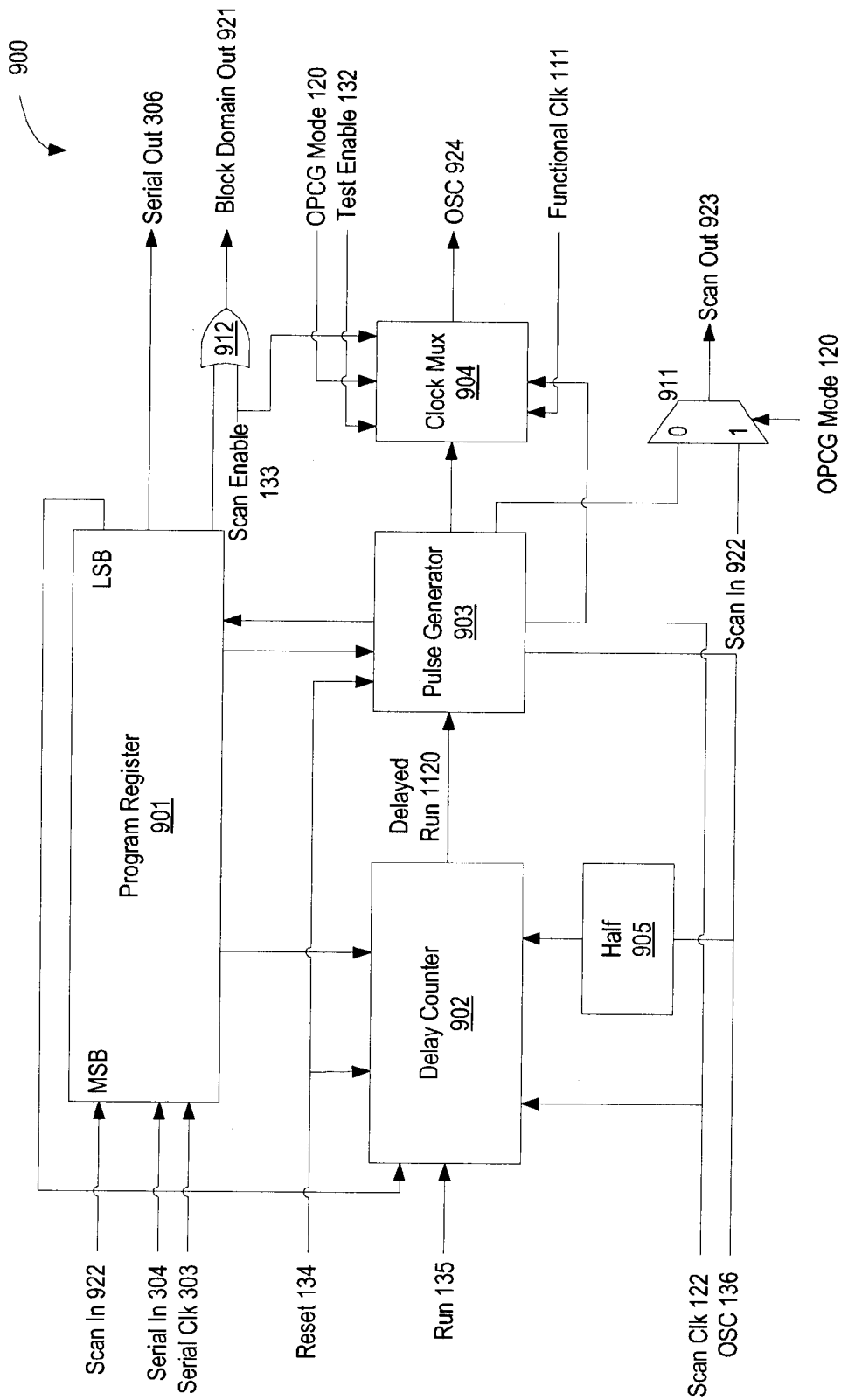
FIG. 9 illustrates an exemplary OPCG clock domain logic, according to one embodiment.
Figure 11:
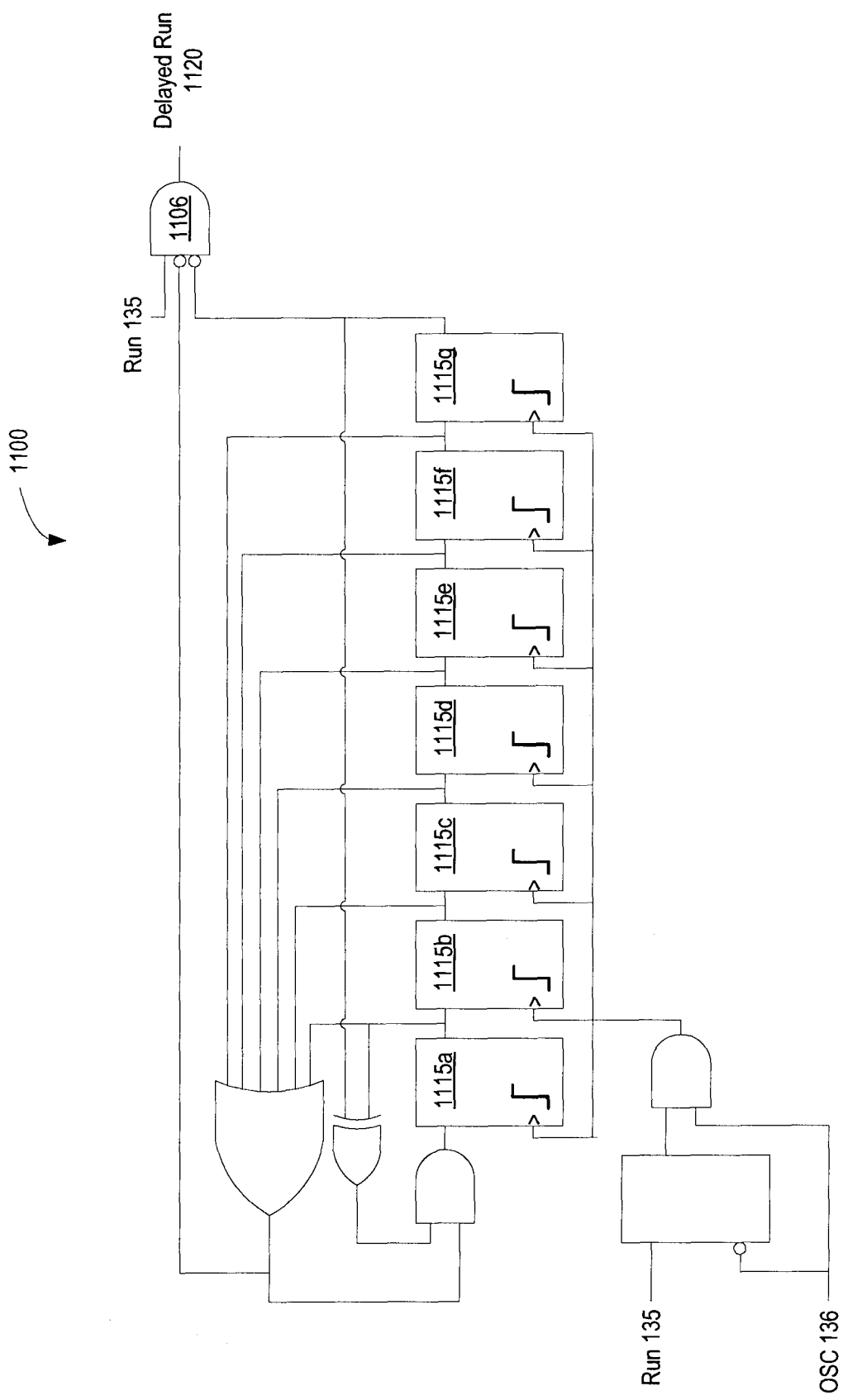
FIG. 11 illustrates an exemplary 7 bit delay counter, according to one embodiment.

FIG. 9 illustrates an exemplary OPCG clock domain logic, according to one embodiment. Optional delay counter 902 receives clock pulses from the domain clock directly or at half the speed of the domain clock by dividing the frequency of input domain OSC clock 136 in half using half logic 905. The output of delay counter 902 is the Delayed Run signal 1120 that is fed to pulse generator 903. An exemplary delay counter implementation is shown in FIG. 11. When run signal 135 is asserted and the delay counter asserts its output by either starting at its terminal value or counting to its terminal value, AND gate 1106 asserts the delayed run input to pulse generator 903, which begins shifting and gating its input OSC clock 136 to produce pulses that feed to clock multiplexor 904. Clock multiplexor 904 selects the output clock from pulse generator 903 and generates output clock 924 to feed the clock domain being run by the OPCG domain logic.

When run signal 135 is de-asserted (0), it forces the output of pulse generator 903 to zero to avoid having to reset program register 901 prior to the clock domain's first programming and running. Otherwise, some spurious pulses could be emitted onto the clock tree of the clock domain. Both delay counter 902 and pulse generator 903 are reloaded in parallel from serially loaded programmable bits within program register 901 via a pulse on reset signal 134. Serial in 304 and serial out 306 are used to concatenate the serially loaded program registers for multiple domains into chains that are operated by serial clock 303 when new OPCG programming bits are loaded. Optional block domain programming bit output 921 is used to facilitate blocking of this domain's inputs from other clock domains when programmed to assert output signal 921. Scan in 922 and scan out 923 are used when the design is not in an OPCG mode and all state elements within the OPCG logic are included within normal scan chains. When in OPCG mode (OPCG Mode 120 is 1), Scan In 922 bypasses the OPCG logic and directly feeds Scan Out 923 via Mux 911. OSC 136 is an input oscillator signal generated from a PLL circuit, received from a clock divider macro, or provided directly by a chip primary input; it is used to run the state machine of the OPCG domain logic providing the functional clock frequency of the domain run by the OPCG domain logic. Clock multiplexor 904 uses test enable 132, OPCG mode 120, and scan enable 133 to select which clock to use to run the clock domain, selecting from functional clock 111, scan clock 122, and the OPCG clock output from the pulse generator 903.

According to one embodiment, the width of program register 901 is determined by the width of delay counter 902, the maximum number of pulses allowed for pulse generator 903, the optional block domain control bit and any other control bits deemed appropriate for being changed on a clocking sequence basis. The order of the bits within serially loaded program register 901 is of little consequence. In this exemplary implementation, the most significant bits of program register 901 are allocated for delay counter 902 starting count value. The next most significant bits are allocated for pulse generator 903. The least significant bit is allocated for the domain input blocking control bit; if the clock domain 900 needs to be programmed to block an input from other clock domains to avoid race conditions if those domains are clocked at the same time, the least significant of bit of the program register 901 is set to logic 1. The domain input blocking signal is OR'ed with scan enable signal 133 at gate 912 and is connected to scan enable inputs to scan multiplexors at the domain's flops that receive data from other domains. The domain input blocking signal may also be used to override any clock gating signals into the domain that come from other domains. For example, if the width of the delay counter register is 5, the maximum number of at-speed pulses is 2, and there is no block domain output, the width of program register 901 is 7 (5+2). If the width of delay counter register is 6, the maximum number of at-speed pulses is 3, and there is a block domain output, the programmable register width is 10 (6+3+1). When reset signal 134 is asserted, delay counter 902 and pulse generator 903 are parallely loaded from program register 901.

Figure 10:
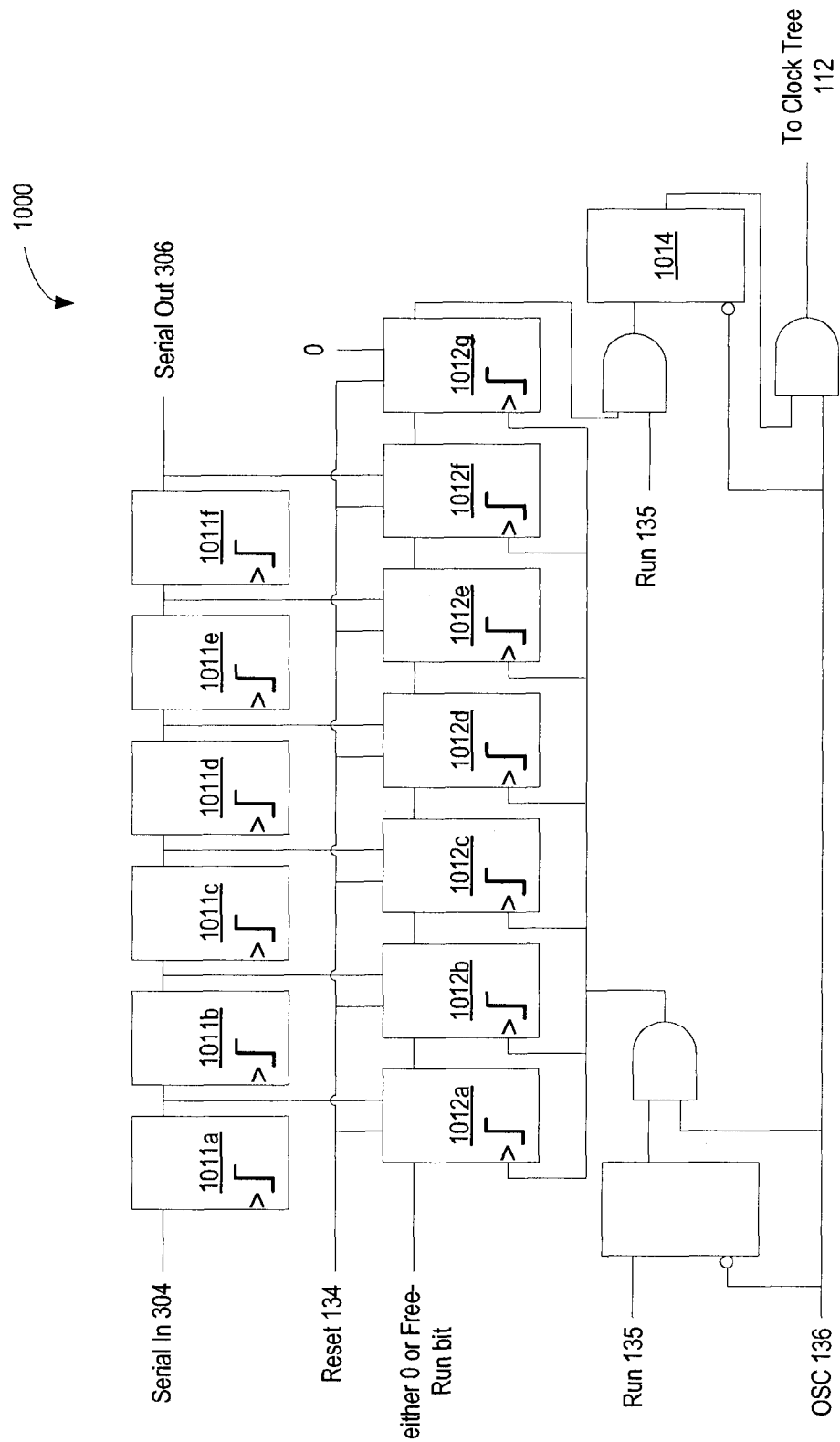
FIG. 10 illustrates an exemplary n-pulse generator with parallel load on reset, according to one embodiment.

FIG. 10 illustrates an exemplary n-pulse generator with parallel load on reset, according to one embodiment. The serially loaded bits 1011a through 1011f constitute a six bit register that can be programmed to emit 0 to 6 pulses. These bits are copied in parallel from the flops 1011 into flops 1012 upon a pulse on reset signal 134 signal arriving. The rightmost flop 1012g is optional, but if implemented, it is always parallel loaded to a zero (0) to ensure no pulses are emitted until a whole cycle after run 135 is asserted. Run signal 135 may be a run signal of OPCG trigger processor logic 311 or the Delayed Run output 1120 of delay counter 902.

Since in this example there are six bit programmable registers 1011a-1011f, pulse generator 1000 generates from 0 to 6 pulses—one pulse for each bit loaded with a value of 1. Programmable registers 1011a-1011f are serially loaded from Serial In 304. An optional delay counter may delay run signal 135. If the main shift register is part of a normal scan chain, there is no separate program register, thus no reset is required, but it must be reloaded on each scan-load of each test. If run signal 135 is fed from a delay counter output, the pulse generation is delayed until the counter counts to its terminal value; in the case of a down counter, it counts down to zero as its terminal value. If the counter is loaded to its terminal value (all zeros for a down counter), there is no delay. Run signal 135 gates the shift register output to force zero when run signal 135 is zero to avoid the need to reset the state elements prior to the first program being loaded. There are no spurious output pulses from the pulse generation logic while the trigger signal is de-asserted. Once run signal 135 is asserted, the shift registers (e.g., 1012a through 1012g) shift their values one bit to the right on each cycle of the OSC 136. If a 1 bit value shifts out of 1012f and into 1012g, on the falling edge of OSC 136, the shift register shifts to the right and that value from 1012g moves into lock-up latch 1014. The output of lock-up latch 1014 gates OSC 136 such that when 1014 contains a zero (0), no OSC pulses emit into clock tree 112; when the output of lock-up latch 1014 contains a one (1), the next cycle appearing on OSC 136 is propagated out onto clock tree 112. Because a zero (0) is shifted into the left bit of the shift register into bit 1012a, as the programmed values shift out to the right, the shift register becomes full of zeros, at which point no more cycles appear on OSC 136 as pulses into clock tree 112, and the domain quiesces. The constant zero (0) feeding into 1012a may be replaced by a program bit (not shown in FIG. 10) to provide a free-run mode for the OPCG domain logic. If the free-run bit is programmed (loaded) to a zero (0), it operates as described above. If the free-run bit is programmed to one (1), the clock gate shift register fills with ones after the Run signal 135 is asserted, resulting in every input OSC 136 pulse appearing on the output To Clock Tree 112 until the Run 135 input is de-asserted. This provides a free-running more of operation that may be useful, for example, for running BIST controllers.

FIG. 11 illustrates an exemplary 7 bit delay counter, according to one embodiment. 7 bit delay counter 1100 does not implement a standard binary counter to be able to count at a high frequency. Register 1115a stores the most significant bit, and register 1115g stores the least significant bit. After registers 1115a-1115g are loaded with programming bits in parallel upon a pulse of reset signal 134 (not shown), the counting sequence starts when run signal 135 is asserted until it counts all the way to all zeros. If delay counter 1100 is loaded with all zeros, there is no delay, and the output delayed run 1120 is asserted as soon as Run 135 is asserted. When delay counter 1100 runs at half the domain frequency, the affect is as if there were one more bit in the counter. The programmed value to start in the counter and the use of half frequency in combination determine the full amount of delay in terms of domain clock cycles.

Figure 12:
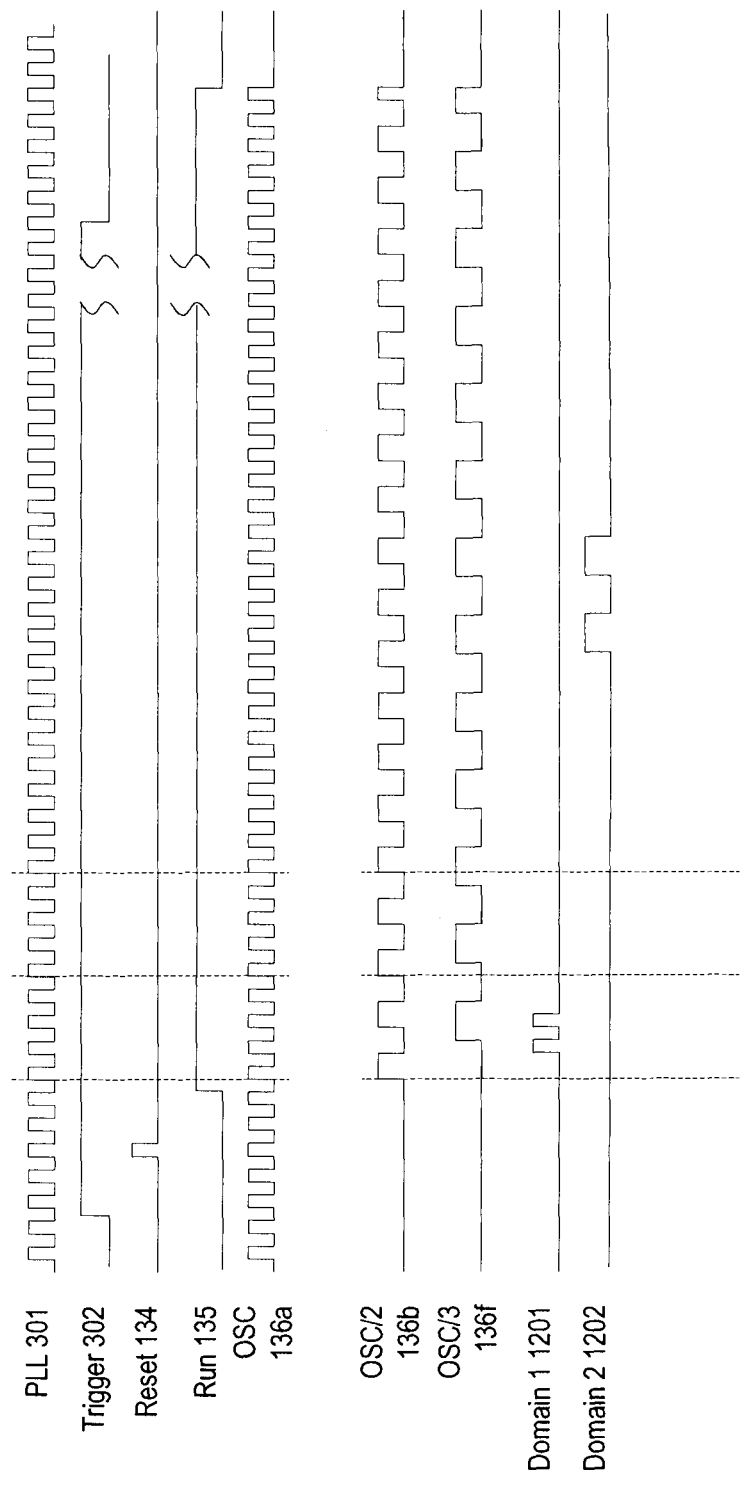
FIG. 12 illustrates exemplary domain output waveforms, according to one embodiment.

FIG. 12 illustrates exemplary domain output waveforms, according to one embodiment. There are two clock domains, domain 1 and domain 2; domain 1 runs at the frequency of signal 136a (same frequency as PLL 301) and is programmed to emit two pulses with no delay after run signal 135 is asserted; domain 2 runs at the OSC/3 frequency of signal 136f and is programmed to emit two pulses after waiting for 5 of its input clock cycles to go by after run signal 135 is asserted. Clock domain pulses 1201 and 1202 show the clock signals for domain 1 and domain 2 with predetermined number of pulses and delays. This example shows that two domains can be included within the same test, but fire at different times to avoid race conditions along possible communication paths between the domains.

The input clock is free running PLL signal 301. PLL signal 301 may be provided by a tester, derived from a PLL circuit from a slower clock received from a tester, or generated from a clock divider. Trigger signal 302 is received from the tester, and trigger processor 311 generates reset signal 134 and run signal 135.

According to one embodiment, OPCG macros (e.g., trigger processor, clock divider, and clock domain) support normal scan testing via tester supplied clocks when operating in a non-OPCG configuration. The scan paths through the state elements are enabled when the OPCG mode disabled. When the OPCG mode is enabled, these scan segments through the OPCG logic are bypassed as shown in FIG. 9. These scan segments may be concatenated into the front of a normal scan chain for non-OPCG test modes to allow the logic within the OPCG domain logic to be tested as normal logic instead of as part of the clock generation circuitry.

Figure 13A:
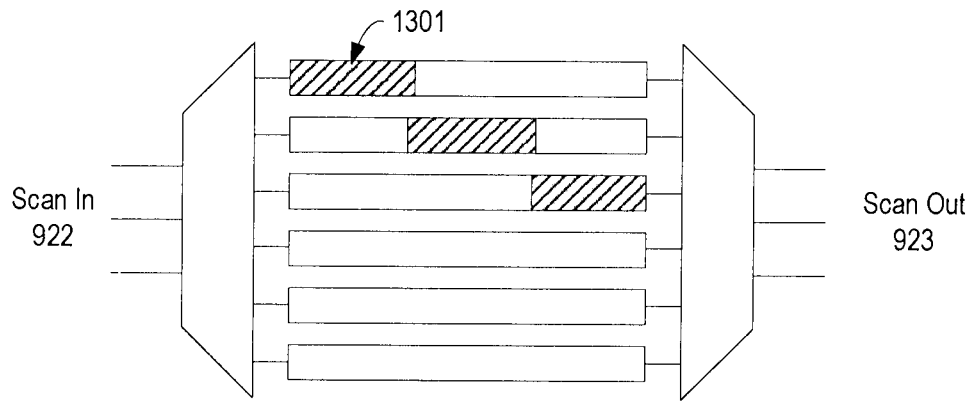
FIG. 13A illustrates an existing design for loading OPCG program bits within normal scan chains.

FIG. 13A illustrates an existing design for loading OPCG program bits within normal scan chains. Segments of OPCG program bits 1301 are contained within normal scan chains, thus compete with ATPG care bits for available decompressor bandwidth. The number of program bits is incrementally increasing as the number of clock domains increase in the design. The program bits are loaded for every test along with normal scan chains.

Figure 13B:
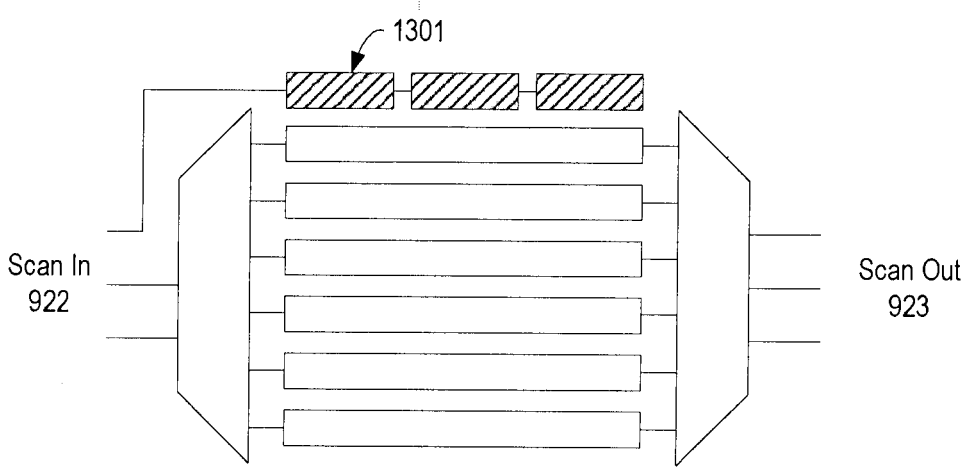
FIG. 13B illustrates an existing design for loading OPCG program bits via dedicated scan-in pins.

FIG. 13B illustrates an existing design for loading OPCG program bits via dedicated scan-in pins. In this design, there is at least one dedicated scan-in pin for feeding the OPCG program bits. Due to the dedicate scan-in pin that is not used for loading normal scan chains, significant scan-in bandwidth is consumed for the OPCG programming. As the number of clock domains increases, additional dedicated scan-in pins may be required. This design may not be feasible for a low pin count design.

Figure 13C:
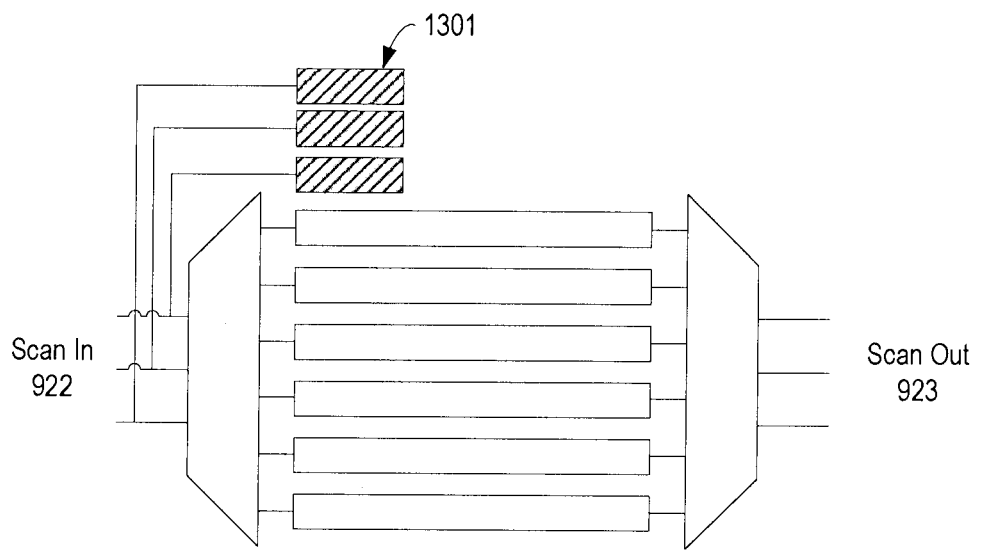
FIG. 13C illustrates an exemplary design for loading OPCG program bits via side-scan chains, according to one embodiment.

FIG. 13C illustrates an exemplary design for loading OPCG program bits via side-scan chains, according to one embodiment. Program bits 1301 are loaded separately from normal scan chains, therefore the efficiency of test data compression is not affected. Scan-in pins 922 are used to load OPCG program bits as well as test data. Program bits are reloaded only when a new clocking sequence is required, and the pre-loaded program bits can be reused without reloading.

A method and system for providing on-product clocks for domains compatible with compression is disclosed. The proposed approach of pulsing multiple clock domains in a test sequence can be used for improving test efficiency for testing chips at wafer test and during module test. When this programmable clocking is used for Logic BIST, it may also be used for testing of higher-level packages, including system testing in the field. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A computer-implemented method, comprising:
  receiving a base clock signal having a frequency for testing a plurality of clock domains;
  receiving a programming instruction from an automated test equipment (ATE) for a first clock domain and a second clock domain of the plurality of clock domains;
  generating a first clock signal for driving the first clock domain and a second clock signal for driving the second clock domain of the plurality of clock domains from the base clock signal based on the programming instruction;
  determining a first delay for the first clock signal and a second delay for the second clock signal from the programming instruction, wherein the second delay is longer than the first delay, and wherein the second delay allows the first clock domain and the second clock domain to be tested in a single test sequence according to the first clock signal and the second clock signal respectively; and
  providing a test sequence comprising the first clock signal delayed by the first delay and the second clock signal delayed by the second delay;
  serially loading the programming instruction into programmable registers;
  receiving a trigger signal from the ATE;
  resetting operational registers to values copied from the programmable registers; and running the test sequence to test the first clock domain and the second clock domain.

2. The computer-implemented method of claim 1, wherein the base clock signal is received from the ATE.

3. The computer-implemented method of claim 1, wherein the base clock signal is generated from a phase-locked loop (PLL) circuit.

4. The computer-implemented method of claim 1, wherein the base clock signal is generated from a higher frequency oscillator source sent through a clock divider circuit to provide a lower frequency signal driving any clock domain of the plurality of clock domains.

5. The computer-implemented method of claim 1 further comprising determining a first number of pulses for the first clock signal and a second number of pulses for the second clock signal based on the programming instruction.

6. The computer-implemented method of claim 1, wherein the first clock signal and the second clock signal are interposed by a delay interval longer than one cycle of the base clock signal.

7. The computer-implemented method of claim 1 further comprising copying the programming instruction stored in the programmable registers to a delay counter with a clock divider at a reset signal, wherein the delay counter determines the delay before pulse generation for a clock domain of the plurality of clock domains being controlled by the programmable registers.

8. The computer-implemented method of claim 7 further comprising running the test sequence upon receipt of a run signal after the delay counter and the pulse generator are programmed and reset by the reset signal.

9. The computer-implemented method of claim 1, wherein the programmable registers for the first clock domain and the second clock domain are loaded from a side-scan chain bypassing any test compression logic.

10. A computer-implemented method, comprising:
receiving a base clock signal having a frequency for testing a plurality of clock domains;
receiving a programming instruction from an automated test equipment (ATE) for a first clock domain and a second clock domain of the plurality of clock domains;
generating a first clock signal for driving the first clock domain and a second clock signal for driving the second clock domain of the plurality of clock domains from the base clock signal based on the programming instruction;
determining a first delay for the first clock signal and a second delay for the second clock signal from the programming instruction, wherein the second delay is longer than the first delay, and wherein the second delay allows the first clock domain and the second clock domain to be tested in a single test sequence according to the first clock signal and the second clock signal respectively; and
providing a test sequence comprising the first clock signal delayed by the first delay and the second clock signal delayed by the second delay;
receiving the programming instruction from a side-scan chain, the side-scan chain being loaded independently from normal scan chains that are used to load care bits for testing; and
holding the programming instruction in the programmable registers until another clocking sequence is applied.

11. A system for generating clocks for a plurality of clock domains from an input clock, the system comprising:
a trigger processor receiving a trigger signal including a programming instruction for a first clock domain and a second clock domain of the plurality of clock domains from an automated test equipment (ATE) and a base clock signal, the base clock having a frequency for testing the plurality of clock domains;
a clock divider generating a first clock signal and a second clock signal from the base clock signal based on the programming instruction; and
a plurality of clock domain logics comprising at least a first clock domain logic driving a first clock domain and a second clock domain logic driving a second clock domain, wherein the first clock domain and the second domain are tested according to the first clock signal and the second clock signal in a single test sequence,
wherein the first clock signal is delayed by a first delay, and
wherein the second clock signal is delayed by a second delay longer than the first delay;
a delay counter and a pulse generator, wherein the delay counter generates the first delay, or the second delay, or both, and wherein the clock pulse generator generates the first clock signal and the second clock signal; and
programmable registers, wherein the programmable registers store the programming instruction and wherein the programmable registers are copied in parallel, at a reset signal, to both the delay counter and the pulse generator.

12. The system of claim 11, wherein the base clock signal is received from the ATE.

13. The system of claim 11, wherein the base clock signal is generated from a phase-locked loop (PLL) circuit.

14. The system of claim 11, wherein the programming instruction contains a first number of pulses for the first clock signal and a second number of pulses for the second clock signal.

15. The system of claim 11, wherein the first clock signal and the second clock signal are interposed by a delay interval longer than one cycle of the base clock signal.

16. The system of claim 11 further comprising receiving the programming instructions from a side-scan chain.

17. The system of claim 11, wherein the test sequence is run at a run signal after the delay counter is programmed and reset by the reset signal, and wherein the test sequence is run at the run signal after the pulse generator is programmed and reset by the reset signal.

18. The system of claim 11, wherein the programmable registers for the first clock domain and the second clock domain are loaded with test compression.

19. A computer-implemented method, comprising:
receiving a base clock signal having a frequency for testing a plurality of clock domains;
receiving a programming instruction from an automated test equipment (ATE) for a first clock domain and a second clock domain of the plurality of clock domains;
generating a first clock signal for the first clock domain and a second clock signal for the second clock domain of the plurality of clock domains from the base clock signal based on the programming instruction;
determining a first delay for the first clock signal and a second delay for the second clock signal from the programming instruction;
providing a test sequence comprising the first clock signal delayed by the first delay and the second clock signal delayed by the second delay, wherein the first clock drives a first clock domain and the second clock drives a second clock domain;
serially loading the programming instruction into programmable registers;
receiving a trigger signal from the ATE;
resetting operational registers to values copied from the programmable registers; and running the test sequence to test the first clock domain and the second clock domain.

20. A computer-implemented method, comprising:

receiving a base clock signal having a frequency for testing a plurality of clock domains;

receiving a programming instruction from an automated test equipment (ATE) for a first clock domain and a second clock domain of the plurality of clock domains;

generating a first clock signal for the first clock domain and a second clock signal for the second clock domain of the plurality of clock domains from the base clock signal based on the programming instruction;

determining a first delay for the first clock signal and a second delay for the second clock signal from the programming instruction;

providing a test sequence comprising the first clock signal delayed by the first delay and the second clock signal delayed by the second delay, wherein the first clock drives a first clock domain and the second clock drives a second clock domain;

receiving the programming instruction from a side-scan chain, the side-scan chain being loaded independently from normal scan chains that are used to load care bits for testing; and holding the programming instruction in the programmable registers until another clocking sequence is applied.

* * * * *